(12) United States Patent
Minich

(10) Patent No.: US 7,320,609 B1
(45) Date of Patent: Jan. 22, 2008

(54) BACKPLANE CONNECTOR

(75) Inventor: Steven E. Minich, York, PA (US)

(73) Assignee: FCI Americas Technology, Inc., Reno, NV (US)

( * ) Notice: Subject to any disclaimer, the term of this patent is extended or adjusted under 35 U.S.C. 154(b) by 0 days.

(21) Appl. No.: 11/627,110

(22) Filed: Jan. 25, 2007

Related U.S. Application Data

(60) Provisional application No. 60/834,415, filed on Jul. 31, 2006.

(51) Int. Cl.
*H01R 12/00* (2006.01)
(52) U.S. Cl. .................................................. 439/79
(58) Field of Classification Search ............ 439/65, 439/79, 74
See application file for complete search history.

(56) References Cited

U.S. PATENT DOCUMENTS

| | | | |
|---|---|---|---|
| 5,772,452 A * | 6/1998 | Aoyama | 439/74 |
| 6,869,292 B2 | 3/2005 | Johnescu et al. | 439/74 |
| 6,994,569 B2 | 2/2006 | Minich et al. | 439/79 |
| 6,997,736 B2 | 2/2006 | Costello et al. | 439/378 |

* cited by examiner

Primary Examiner—Khiem Nguyen
(74) Attorney, Agent, or Firm—Woodcock Washburn LLP

(57) ABSTRACT

A card assembly includes two spaced-apart circuit boards defining an interior region between the cards. Connectors may be mounted on the circuit boards and be located within the interior region. That is, respective interior sides of the circuit boards may face each other and the interior region. A connector may be mounted on each interior side. Mounting the connectors in the interior region provides an assembly that defines a mating footprint that is independent of the respective thicknesses, and variations in the thicknesses, of the spaced-apart printed circuit boards.

23 Claims, 6 Drawing Sheets

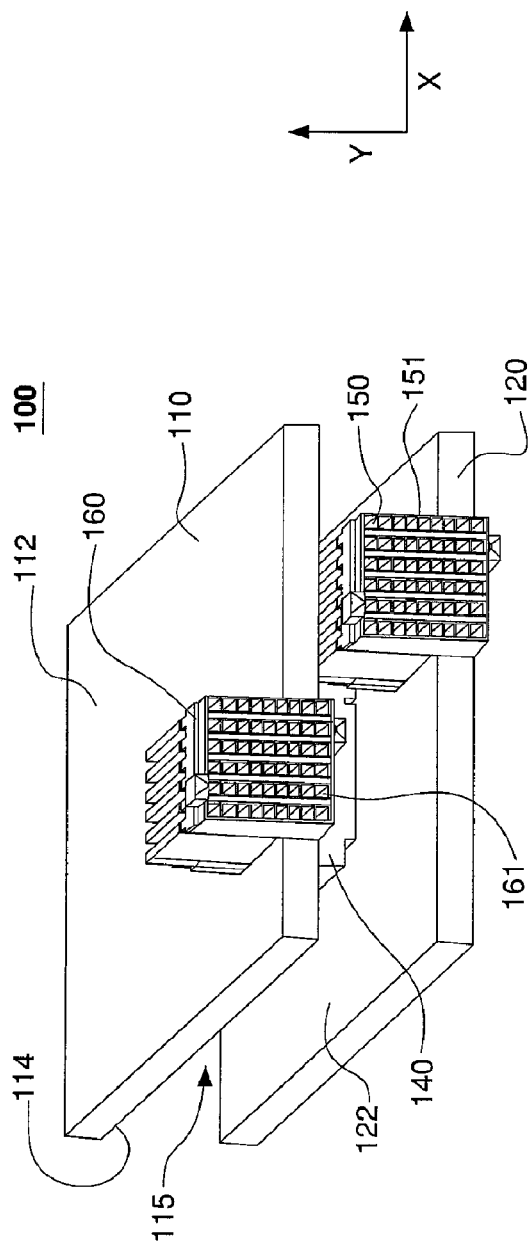
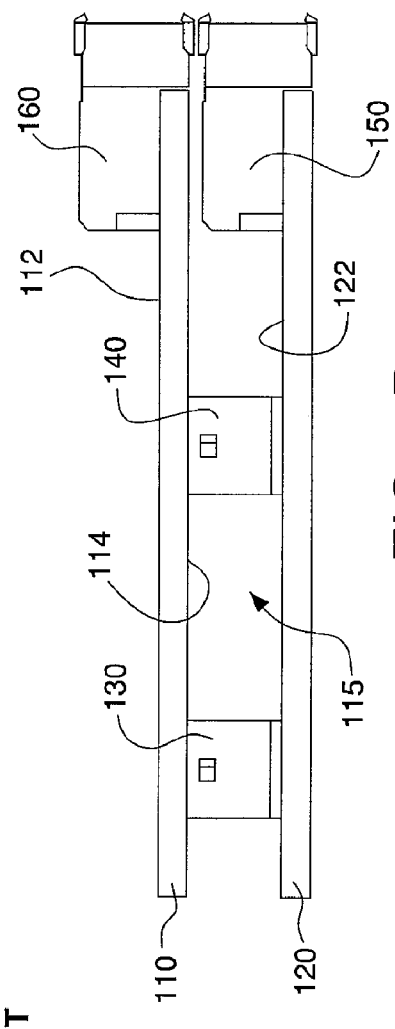
FIG. 1A
PRIOR ART
FIG. 1B
PRIOR ART

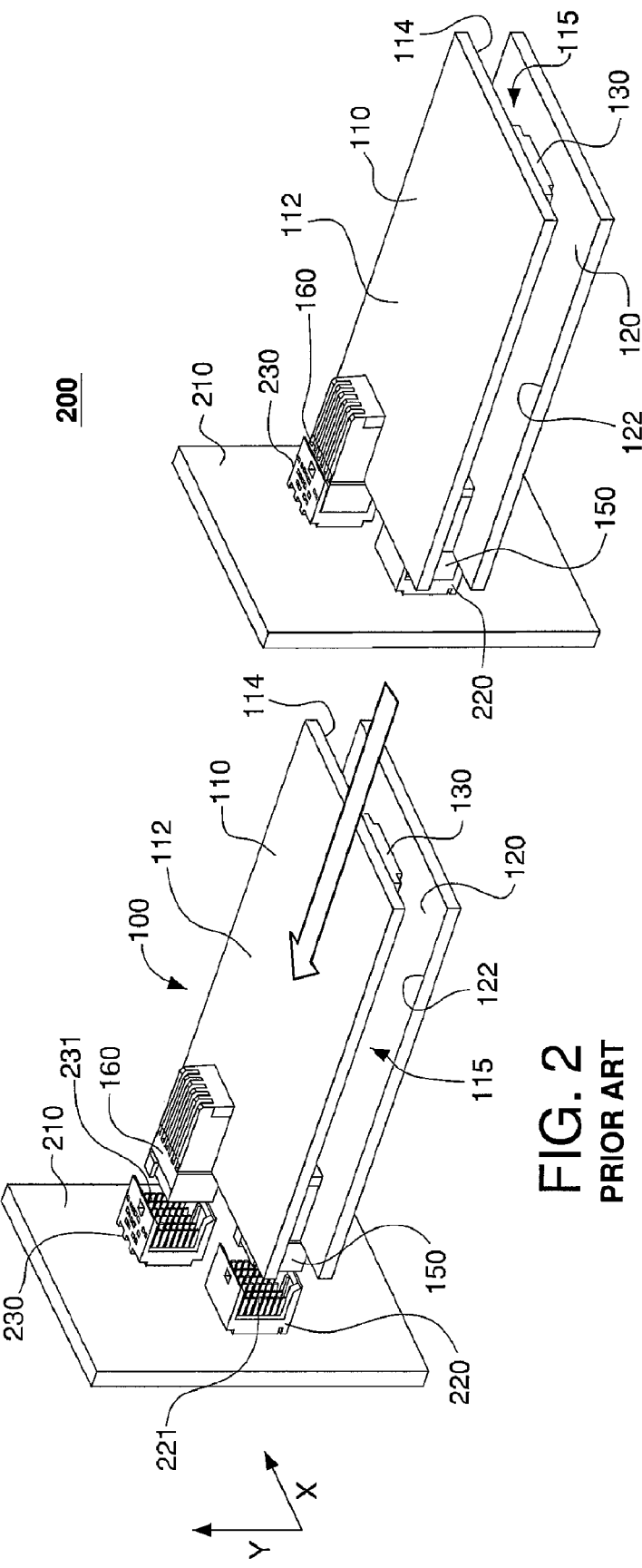

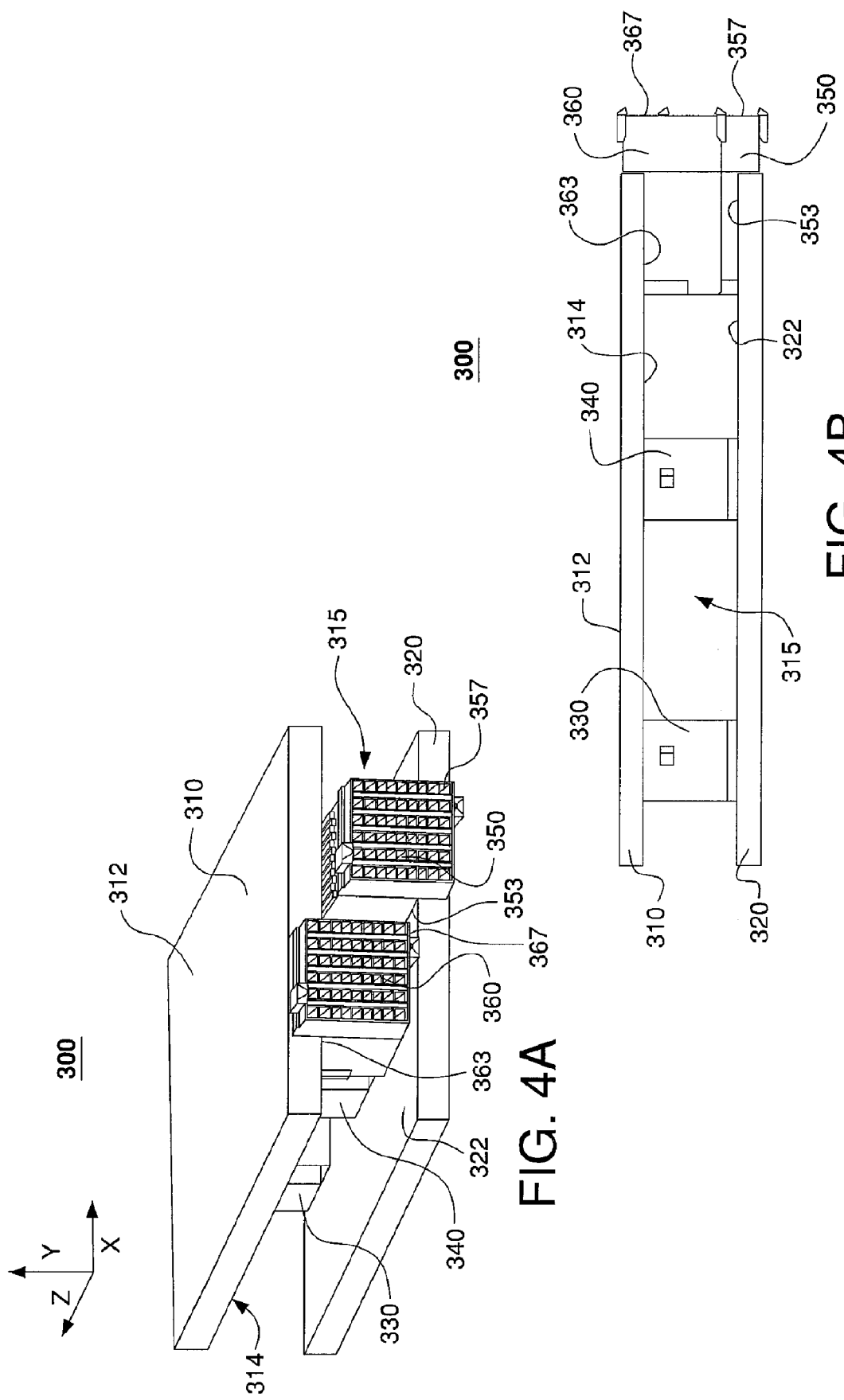

BACKPLANE CONNECTOR

CROSS-REFERENCE TO RELATED APPLICATIONS

This application claims benefit under 35 U.S.C. § 119(e) of provisional U.S. patent application No. 60/834,415, filed Jul. 31, 2006, the contents of which are incorporated herein by reference.

FIELD OF THE INVENTION

Generally, the invention relates to electrical connector systems. More particularly, the invention relates to a card connector assembly with a mating footprint that is independent of and unaffected by variations in card thickness.

BACKGROUND OF THE INVENTION

FIGS. 1A and 1B, respectively, are isometric and side views of an example prior art card assembly 100. As shown, the assembly 100 may include two circuit boards 110, 120 disposed in a parallel arrangement. An interior region 115 is defined between the first and second circuit boards 110, 120. Two vertical connectors 130, 140 connect the first and second circuit boards 110, 120. A first right-angle connector 160 is connected to a side 112 of the first circuit board 110 that faces away from the interior region 115. A second right-angle connector 150 is connected to a side 122 of the second circuit board 120 that faces the interior region 115.

FIG. 2 depicts a prior art card assembly 100 being mated to an electrical device 210. The electrical device 210 includes two vertical connectors 220, 230, each positioned to receive a respective one of the right-angle connectors 150, 160 of the assembly 100.

FIGS. 3A and 3B, respectively, are isometric and side views of an assembly 200 that includes the mezzanine card assembly 100 mated to the device 210. As shown in FIG. 3B, a distance A is defined between the inner side 122 of the circuit board 120 and the inner side 114 of the circuit board 110 (i.e., the sides 114, 122 of the boards 110, 120 that face the interior region 115 of the assembly 100). The distance A may be defined by the height H of the vertical connectors 130, 140. The circuit board 110 may define a thickness B that is equal to a nominal thickness plus or minus a thickness tolerance. The thickness tolerance may be as much as 10%, or more, of the nominal thickness. A distance C may be defined from the inner side 122 of the circuit board 120 and the outer side 112 of the circuit board 110. That is, the distance C may be defined between mounting interfaces 153, 163 of, respectively, the right-angle connectors 150, 160. Thus, the distance C is defined by the distance A (between the inner sides 114, 122 of the circuit boards 110, 120) plus the thickness B of the circuit board 110.

A problem may be that the thickness tolerance of the thickness B of the circuit board 110 may inhibit proper positioning of one or more of the right-angle connectors 150, 160 with respect to the corresponding vertical connectors 220, 230 on the device 210. High mating forces or component damage may result.

SUMMARY OF THE INVENTION

A card assembly according to one aspect of the invention may enable mating of a card assembly with an electrical device despite variations in thicknesses of the printed circuit boards of the assembly. Such an assembly may be, for example, a mezzanine assembly or a mezzanine daughter-card assembly. The card assembly may include two spaced-apart circuit boards defining an interior region between the cards. Connectors may be mounted on the circuit boards and be located within the interior region. That is, respective interior sides of the circuit boards may face each other and the interior region. A connector may be mounted on each interior side.

Mounting connectors in the interior region provide an assembly defining a mating footprint that is independent of the respective thicknesses of the spaced-apart printed circuit boards. In this way, the assembly may be mated with an electrical device such as a backpanel (e.g., a backplane, midplane, etc.) without board thickness affecting the mating properties between the assembly and the device.

One embodiment of the invention is an assembly such as, for example, a daughtercard mezzanine assembly, that includes a first circuit board defining a first side and a second circuit board connected to the first circuit board and defining a second side that faces the first side of the first circuit board. A first electrical connector is connected to the first side of the first circuit board and defines a first mating interface for electrical connection to an electrical device. A second electrical connector is connected to the second side of the second circuit board and defines a second mating interface for electrical connection to the electrical device.

An alternative embodiment, for example, is an assembly that includes an electrical device, a first circuit board defining a first side, and a first electrical connector connected to the first side of the first circuit board and to the device. A second circuit board is connected to the first circuit board and defines a second side that faces the first side. A second electrical connector is connected to the second side of the second circuit board and to the device.

Another alternative embodiment, for example, is an assembly that includes a first circuit board having a first board thickness, and a second circuit board positioned a separation distance from the first circuit board, the second circuit board having a second board thickness. A first electrical connector is connected to the first circuit board and defines a first mating interface. A second electrical connector is connected to the second circuit board and defines a second mating interface. The first mating interface and the second mating interface together define a mating footprint of the assembly that is independent of each of the first and the second board thickness.

BRIEF DESCRIPTION OF THE DRAWINGS

FIGS. 1A and 1B, respectively, are isometric and side views of an example mezzanine card assembly.

FIG. 2 depicts a mezzanine card assembly being mated to an electrical device.

FIGS. 3A and 3B, respectively, are isometric and side views of a mezzanine card assembly mated to an electrical device.

FIGS. 4A and 4B, respectively, are isometric and side views of an example mezzanine card assembly according to an embodiment of the invention.

DETAILED DESCRIPTION OF ILLUSTRATIVE EMBODIMENTS

Figure 3B:
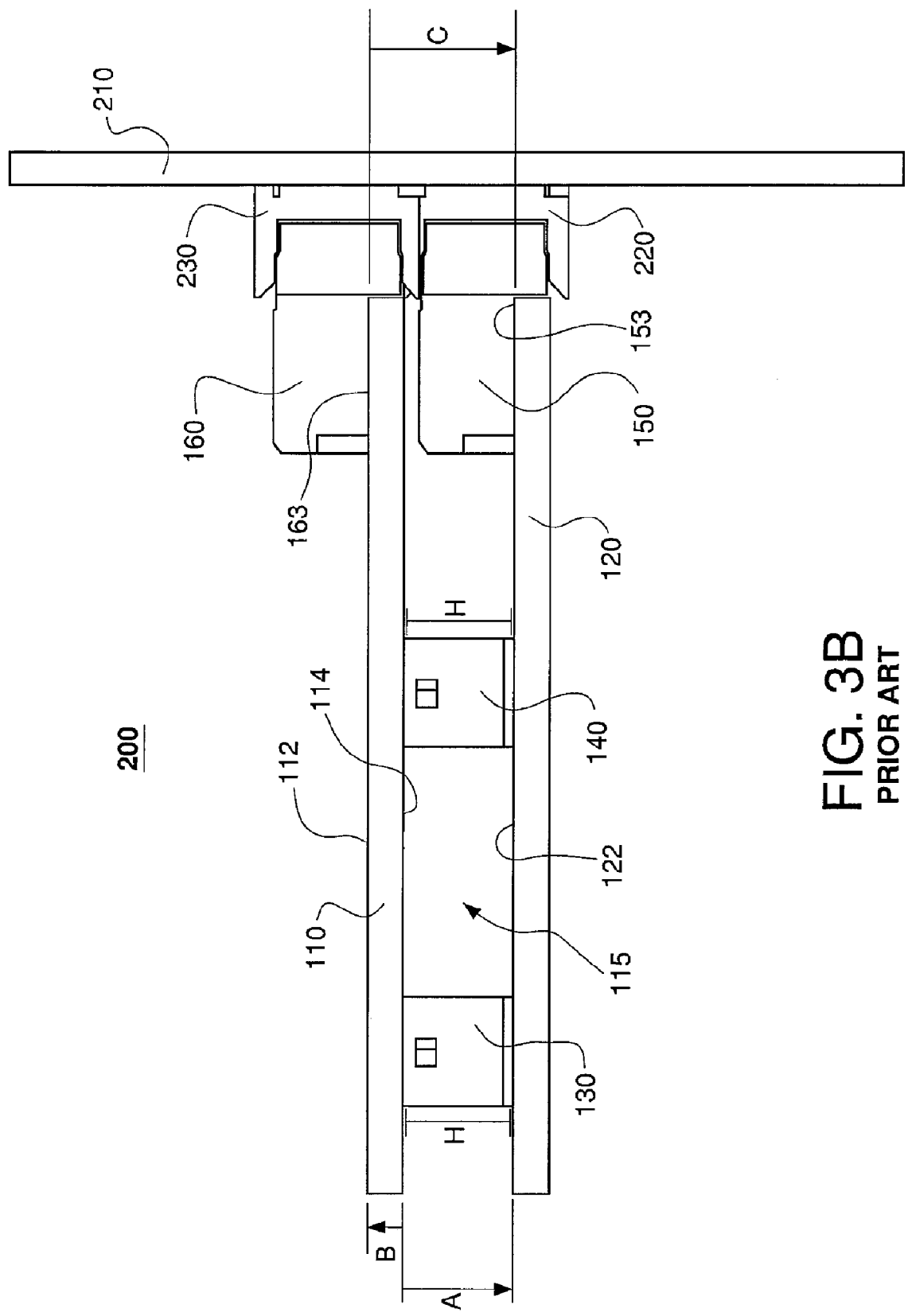

FIGS. 4A and 4B, respectively, are isometric and side views of an example mezzanine card assembly 300 according to an embodiment of the invention. Such an assembly 300 may be, for example, a mezzanine daughtercard assembly. As shown, the assembly 300 may include two circuit boards 310, 320 disposed in a parallel arrangement. That is, X and Z arrows of FIG. 4A may define an XZ plane, and the printed circuit boards 310 and 320 each may define a plane that is parallel to XZ plane as well as to each other. An interior region 315 is defined between the circuit boards 310, 320. One or more vertical connectors 330, 340 may connect the circuit boards 310, 320.

A right-angle connector 350 may be connected to or mounted on a side 322 of the circuit board 320 that faces the interior region 315 of the mezzanine card assembly 300. A right-angle connector 360 may be connected to or mounted on a side 314 of the circuit board 310 that faces the interior region 315. In comparison to the right-angle connector 160 of FIGS. 1A-3B, the right-angle connector 360 may be rotated 180° about an imaginary axis extending in the direction indicated by the Z arrow. Thus "upside down," the connector 360 may be connected to the side 314 of the circuit board 310.

The connectors 350, 360 may be connected to or mounted on, respectively, sides 322, 314. The sides 322, 314 face each other as well as the interior region 315. As shown, the right-angle connectors 350, 360 may be offset from one another in the directions indicated by the X and Y arrows or in directions opposite the directions indicated by the X and Y arrows.

Electrical connectors such as the right-angle connectors 350, 360 each generally may define a respective mounting interface 353, 363 and a respective mating interface 357, 367. A mounting interface such as one of the mounting interfaces 353, 363 may be an interface for connecting the electrical connection to, or mounting it on, a printed circuit board. A mating interface such as one of the mating interfaces 357, 367 may be an interface for connecting the electrical connector to, or mating it with, another electrical connector. Each of the mounting interfaces 353, 363 and the mating interfaces 357, 367, respectively, of the right angle connectors 350, 360 may extend in two directions and define, respectively, mounting and mating planes.

For example, as may best be seen in FIG. 4A, the electrical connector 350 defines a mating interface 357 that extends in the directions indicated by the X and Y arrows, thus defining a mating plane in the XY plane. The mating interface 367 of the right-angle connector 360 may define a plane in the XY plane that is coplanar or parallel with the plane defined by the mating interface 357 of the connector 350.

Likewise, the mounting interface 353 of the electrical connector 350 extends in the directions indicated by the arrows X and Z thus defining a mounting plane in the XZ plane. The mounting interface 363 of the electrical connector 360 may also define a plane in the XZ plane that is coplanar or parallel with the plane defined by the mounting interface 353 of the connector 350. Alternatively, board or card spacings could be modified to permit orthogonal midplane configurations, with or without shared plated throughholes. Example right-angle connectors are disclosed in U.S. Pat. No. 6,994,569, the disclosure of which is incorporated herein by reference.

The vertical connectors 330, 340 may be connectors that define respective mounting planes that are parallel to respective mating planes. Example vertical or mezzanine connectors include the Gig-Array product line by FCI, the assignee of the instant application, as well as others, such as those disclosed in U.S. Pat. No. 6,869,292, the disclosure of which is incorporated herein by reference.

Figure 5:
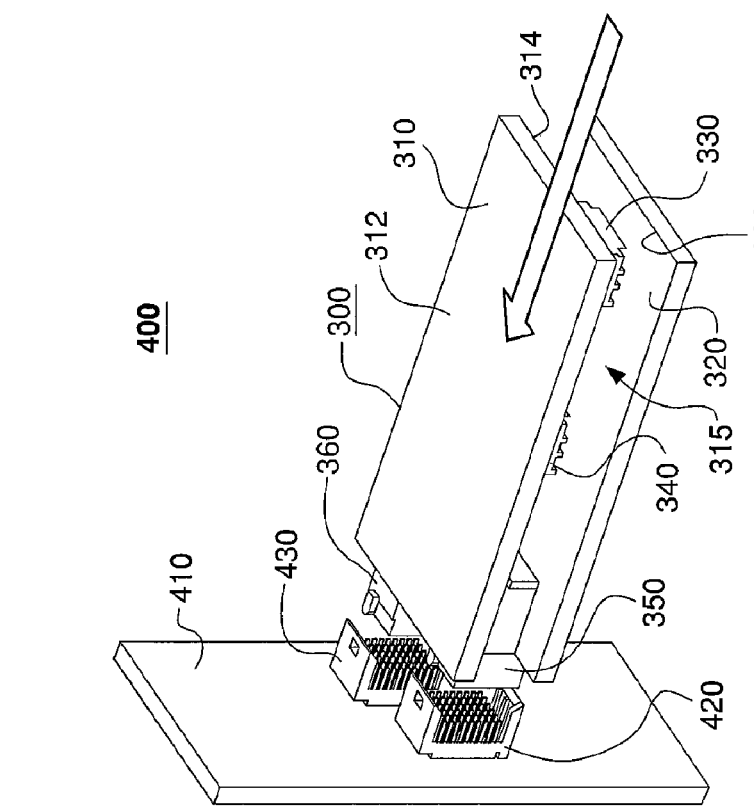
FIG. 5 depicts an isometric view of an assembly according to an aspect of the invention that includes a mezzanine card assembly being mated to an electrical device.

FIG. 5 depicts an isometric view of an assembly 400 that includes a mezzanine card assembly 300 being mated to an electrical device 410. The device 410 may include two vertical connectors 420, 430, which may be header or receptacle connectors and may be positioned to receive a respective mating interface 357, 367 of one of the right-angle connectors 350, 360 of the assembly 300. The device 410 may be any type of electrical device that electrically connects to other assemblies or devices through the use of electrical connectors such as the connectors 420, 430. An example of such an electrical device is a backplane. As used herein, the term "backplane" refers to any backpanel or midpanel to which the card assembly 300 may be mounted.

The right-angle connectors 350, 360 may define a mating footprint of the mezzanine card assembly 300, and the vertical connectors 420, 430 may define a mating footprint of the electrical device 410. That is, the mating interfaces 357, 367 of the right-angle connectors 350, 360 may combine to define the mating footprint of the card assembly 300. The mating footprint of the card assembly 300 may complement the mating footprint defined by the vertical connectors 420, 430 thus enabling the card assembly 300 to be connected to the device 410.

The device 410 may extend in the directions indicated by the X and Y arrows, thus defining a plane in the XY plane. As shown, the right-angle connectors 350, 360 may be offset from one another in both the X and Y directions to align with respective mating interfaces of the vertical connectors 420, 430.

Figure 6A:
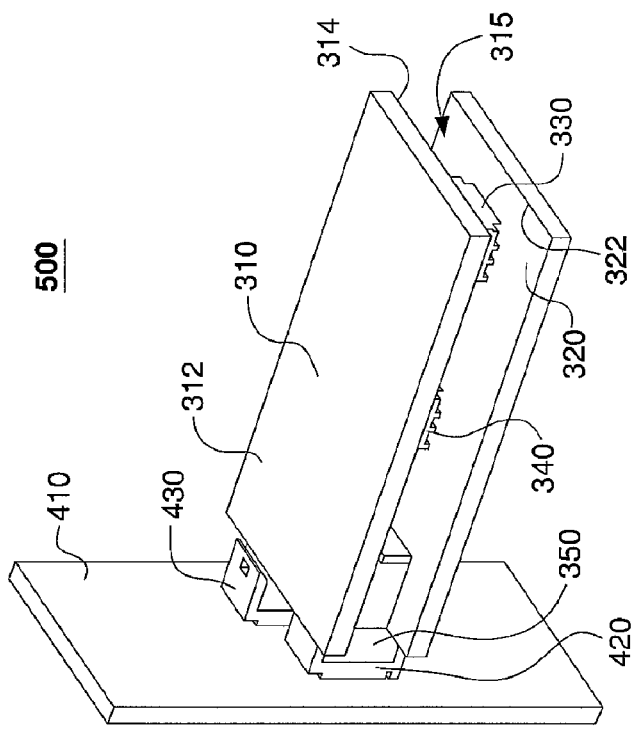
FIGS. 6A and 6B, respectively, are isometric and side views an assembly according to an embodiment of the invention that includes a mezzanine card assembly mated to an electrical device.
Figure 6B:
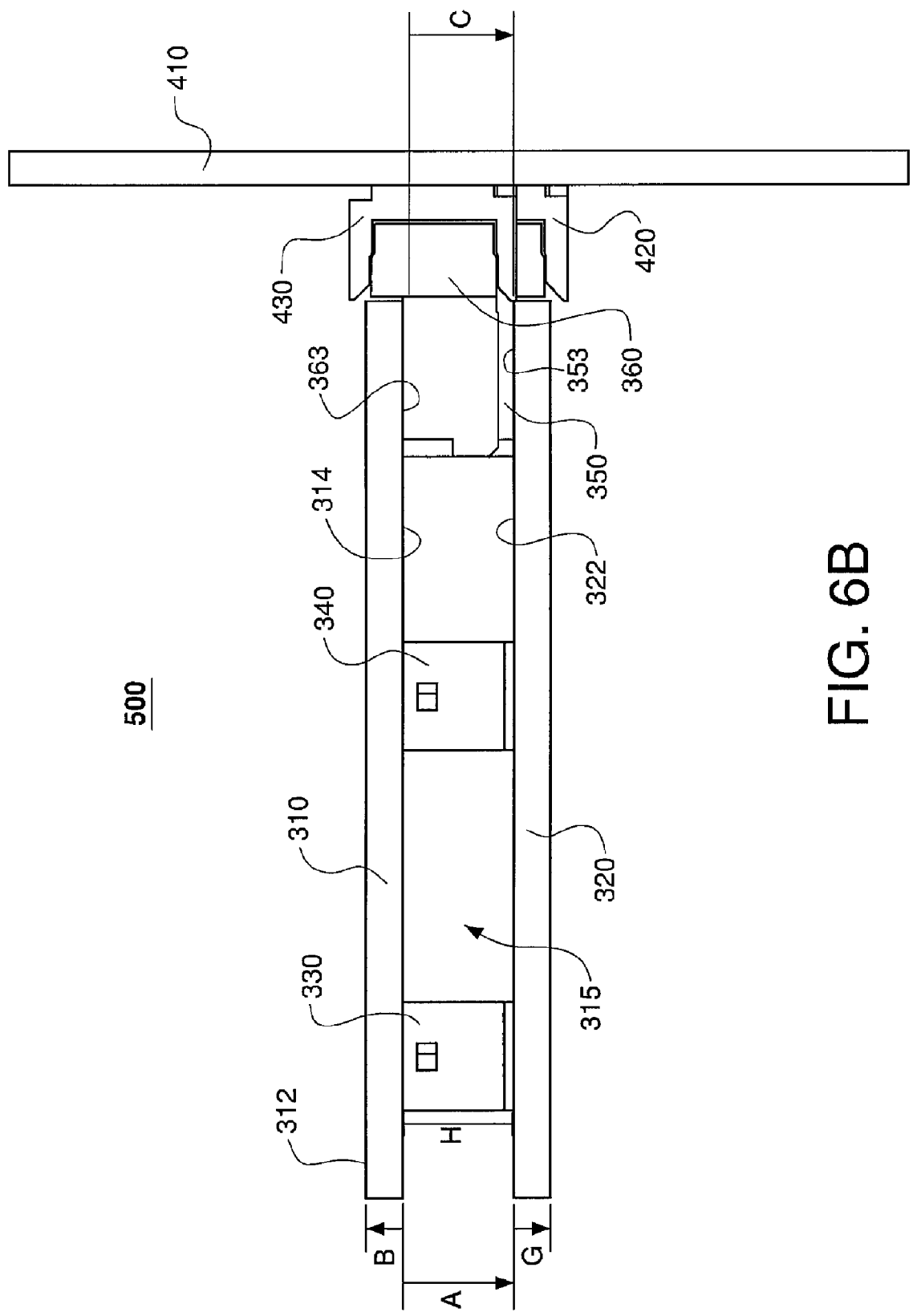

FIGS. 6A and 6B, respectively, are isometric and side views of an assembly 500 according to one embodiment of the invention. The assembly 500 includes the card assembly 300 mated to the electrical device 410. As may best be seen in FIG. 6B, the distance A between the inner sides 314, 322 of the circuit boards 310, 320 (i.e., the sides that face the interior region of the assembly 300) may be defined by the height H of the vertical connectors 330, 340. That is, the vertical connectors 330, 340 may define a separation distance A between the side 314 of the circuit board 310 and the side 322 of the circuit board 320. U.S. patent application Ser. No. 11/450,606, filed on Jun. 9, 2006, the disclosure of which is incorporated herein by reference, discloses electrical connectors with adjustable pins or cavity depths that facilitate adjustment of stack height.

It should be noted that, in alternative embodiments of the invention, the circuit boards 310, 320 may be separated by any type of device, fixture, separator, or spacer. For example, the circuit boards 310, 320 may be separated by any spacer or a plurality of spacers that physically attaches to each circuit board and maintains separation between at least a portion of the boards. Such spacers may physically attach to, for example, the sides of the circuit boards 310, 320. The interior region 315 between the circuit boards 310, 320 may be maintained though the circuit boards 310, 320 are not electrically connected to one another through an electrical connector such as the connectors 330, 340. Such spacers would merely ensure a physical connection of the boards.

It should also be noted that, while the embodiment depicted in FIGS. 4A-6B show the circuit boards 310, 320 in a parallel arrangement, other aspects of the invention include embodiments where the circuit boards are not in such a parallel arrangement. In some embodiments, an interior region is defined between the circuit boards of an assembly, but the circuit boards are not parallel to one another. Such circuit boards may be physically connected through a spacer, device, fixture, or separator, or may be electrically connected by an electrical connector.

The circuit board 310 may define a thickness B that includes a nominal thickness plus or minus a thickness tolerance. The thickness tolerance may be about 10% of the nominal thickness. The distance C is defined between the mounting interface 353 of the right-angle connector 350 and the mounting interface 363 of the right-angle connector 360. The distance C is defined between the inner side 314 of the circuit board 310 and the inner side 322 of the circuit board 320 and thus may be the same as the distance A. That is, by rotating the connector 360 about the imaginary Z axis as described above with regard to FIG. 4C (and as compared to the connector 160 described in FIGS. 1-3B), and mounting the connector 360 on the side 314 of the circuit board 310, the distance C between mounting interfaces 353, 363 of the connectors 350, 360 may equal the distance A between sides 314, 322 of the respective circuit boards 310, 320.

Thus, the right-angle connectors 350, 360 may define a mating footprint that is independent of the board thickness B of the circuit board 310. Consequently, the variation in the thickness B of the circuit board 310 is irrelevant to the proper positioning of the right-angle connectors 350, 360 when mating the assembly 300 with the vertical connectors 420, 430 of the device 410.

Likewise, the circuit board 320 may define a thickness G that includes a nominal thickness plus or minus a thickness tolerance. The thickness tolerance may be about 10% of the nominal thickness. The mating footprint of the assembly 300 may also be independent of the board thickness G of the circuit board 320, and any variation in the thickness G of the circuit board 320 is irrelevant to the proper positioning of the right-angle connectors 350, 360 when mating the assembly 300 with the vertical connectors 420, 430 of the device 410.

It should be noted that the mounting footprints of any of the connectors 350, 360, 330, 340, 420, 430 may incorporate any through-hole or surface mount technology. For example, any mounting footprint may be press-fit, ball-grid array, or the like.

The device 410 may be a midpanel, and the vertical connectors 420, 430 may be routed through the device 410 by direct-plated through holes or a via/trace arrangement so that the assembly 300 can be arranged orthogonally to another such assembly located on an opposite side of the device 410.

What is claimed is:

1. An assembly, comprising:
   a first circuit board defining a first side;
   a second circuit board defining a second side that faces the first side of the first circuit board;
   at least one vertical connector connecting the first circuit board and the second circuit board;
   a first electrical connector connected to the first side of the first circuit board and defining a first mating interface for electrical connection to an electrical device; and
   a second electrical connector connected to the second side of the second circuit board and defining a second mating interface for electrical connection to the electrical device;
   wherein the first mating interface and the second mating interface are offset in a first direction and in a second direction that is transverse to the first direction.

2. The assembly of claim 1 further comprising a vertical connector electrically connecting the first circuit board to the second circuit board.

3. The assembly of claim 1, wherein the first circuit board is electrically connected to the second circuit board.

4. The assembly of claim 1 wherein each of the first and second electrical connectors are right-angle connectors.

5. The assembly of claim 1, wherein the first side defines a first plane, the second side defines a second plane, and the first and second planes are parallel.

6. The assembly of claim 1, wherein the first and second mating interfaces are coplanar.

7. An assembly, comprising:
   an electrical device;
   a first circuit board defining a first side;
   a first electrical connector connected to the first side of the first circuit board and to the device;
   a second circuit board defining a second side that faces the first side;
   a second electrical connector connected to the second side of the second circuit board and to the device; and
   at least one vertical connector connecting the first circuit board and the second circuit board;
   wherein the first electrical connector and second electrical connector are offset in a first direction and in a second direction that is transverse to the first direction.

8. The assembly of claim 7, further comprising a third electrical connector connecting the second circuit board to the first circuit board.

9. The assembly of claim 8, wherein the third electrical connector is mounted on the first side of the first circuit board and the second side of the second circuit board.

10. The assembly of claim 7, wherein at least one of the first and second electrical connectors is a right-angle connector.

11. The assembly of claim 7, wherein the device is a backplane.

12. The assembly of claim 7, wherein the first circuit board is electrically connected to the second circuit board.

13. The assembly of claim 7, wherein the first electrical connector is the same as the second electrical connector, extends in a first direction, and is rotated 180° about an imaginary axis extending in the first direction with respect to the second electrical connector.

14. An assembly, comprising:
   a first circuit board having a first board thickness;
   a second circuit board positioned a separation distance from the first circuit board, the second circuit board having a second board thickness;
   at least one vertical connector connecting the first circuit board and the second circuit board;
   a first electrical connector connected to the first circuit board and defining a first mating interface;
   a second electrical connector connected to the second circuit board and defining a second mating interface, wherein the first mating interface and the second mating interface are offset in a first direction and in a second direction that is transverse to the first direction, and the first mating interface and the second mating interface define a mating footprint of the assembly that is independent of each of the first and the second board thickness.

15. The assembly of claim 14, wherein the first electrical connector is a right-angle connector.

16. The assembly of claim 14, wherein the first circuit board is electrically connected to the second circuit board.

17. The assembly of claim 16, further comprising a vertical connector electrically connecting the first and second circuit boards.

18. The assembly of claim 17, wherein the vertical connector defines the separation distance.

19. The assembly of claim 14, wherein the first circuit board defines a first side and the second circuit board defines a second side that faces the first side, and wherein the first electrical connector is connected to the first side of the first circuit board, and wherein the second electrical connector is connected to the second side of the second circuit board.

20. The assembly of claim 14, wherein the first circuit board is parallel to the second circuit board, defining an interior region between the first and second circuit boards, and wherein the first connector is connected to a side of the first circuit board that faces the interior region and the second connector is connected to a side of the second circuit board that faces the interior region.

21. The assembly of claim 1 wherein the first mating interface and the second mating interface are at least partially opposite each other in one of the first or second direction.

22. The assembly of claim 7 wherein the first electrical connector and second electrical connector are at least partially opposite each other in one of the first or second direction.

23. The assembly of claim 14 wherein the first mating interface and the second mating interface are at least partially opposite each other in one of the first or second direction.

* * * * *